United States Patent
Takemoto et al.

(10) Patent No.: US 7,492,901 B2
(45) Date of Patent: Feb. 17, 2009

(54) SINGLE-PHOTON GENERATOR AND SINGLE-PHOTON GENERATING METHOD

(75) Inventors: Kazuya Takemoto, Kawasaki (JP); Tatsuya Usuki, Kawasaki (JP); Motomu Takatsu, Kawasaki (JP)

(73) Assignee: Fujitsu Limited, Nakahara-Ku, Kawasaki-Shi, Kanagawa (JP)

( * ) Notice: Subject to any disclaimer, the term of this patent is extended or adjusted under 35 U.S.C. 154(b) by 1043 days.

(21) Appl. No.: 10/779,816

(22) Filed: Feb. 18, 2004

(65) Prior Publication Data

US 2004/0197070 A1 Oct. 7, 2004

(30) Foreign Application Priority Data

Feb. 20, 2003 (JP) .............................. 2003-043188

(51) Int. Cl.
*G02B 6/00* (2006.01)
*G02F 1/03* (2006.01)
*G02F 1/07* (2006.01)

(52) U.S. Cl. .................... 380/263; 385/147; 380/256; 380/278; 257/53

(58) Field of Classification Search .................. 380/263
See application file for complete search history.

(56) References Cited

U.S. PATENT DOCUMENTS

2002/0196827 A1* 12/2002 Shields et al. ................. 372/45

FOREIGN PATENT DOCUMENTS

JP 2001-230445 8/2001
JP 2002-268104 9/2002

OTHER PUBLICATIONS

Yamamoto, Y., et al, 'Single photons for quantum information systems', National Institute of Informatics, Dec. 6, 2004, entire document, http://www.nii.ac.jp/pi/n1/1_5.pdf.*

* cited by examiner

*Primary Examiner*—Kambiz Zand
*Assistant Examiner*—Ronald Baum
(74) *Attorney, Agent, or Firm*—Fujitsu Patent Center

(57) ABSTRACT

A single-photon generator includes an exciton generation part including therein a quantum dot, an excitation part for generating an exciton in the exciton generator part, a recombination control part for controlling recombination timing of the exciton in the exciton generation part, and an optical window provided in the exciton generation part so as to pass a single photon formed as a result of recombination of the exciton, wherein the recombination control part causes, in the exciton generation part, recombination of the excitons at longer intervals than a recombination lifetime of a exciton molecule.

20 Claims, 7 Drawing Sheets

FIG.5A INCIDENT PULSE
FIG.5B RECOMBINATION PROBABILITY
FIG.5C APPLIED VOLTAGE
FIG.5D SHUTTER

SINGLE-PHOTON GENERATOR AND SINGLE-PHOTON GENERATING METHOD

CROSS-REFERENCE TO RELATED APPLICATION

The present application is based on Japanese priority application No.2003-043188 filed on Feb. 20, 2003, the entire contents of which are hereby incorporated by reference.

BACKGROUND OF THE INVENTION

The present invention generally relates to optical sources, and more particularly to a single-photon generator and single-photon generation method.

Safe and secure cryptographic telecommunication is indispensable technology for realizing the next generation information society including electronic government, electronic commerce, and the like.

Currently, the RSA public key cryptosystem is used extensively in the Internet for providing security on communications exchanged through the Internet. According to the RSA public key cryptosystem, the security is provided solely on the principle of difficulty of calculating the factorization of polynomials into prime numbers and thus relies on the difficulty of conducting huge amount of calculation in a practical time. This means, on the other hand, that when a quantum computer, capable of conducting parallel processing at enormously high speed is realized, the time needed for decrypting a code is shortened drastically, and it is no longer possible to prevent copying, such as wiretapping or falsification, of data by a third party when public key cryptosystem is used.

Quantum cryptography is expected to provide solution to this problem of security.

In quantum cryptography, information is transmitted not in the form of conventional aggregate or bunch of photons but in the form of single photons.

In the case one bit of information is imparted to a single photon in the form of polarization information, for example, the information thus given to each photon complies with the uncertainty principle and no-cloning theorem, and because of this, it becomes no longer possible to take out the bit information without destroying the state of the photon. Thus, in the case a third party has conducted copying or falsification of the information in the communication path, such a conduct is detected immediately.

Thus, in the case of using quantum cryptography, the security of cryptographic key shared between two parties is guaranteed by the physical principle, not by the quantity of calculation, as long as a single photon is used for the carrier of the information. On the other hand, in order to secure the security of such a cryptographic key and to eliminate the risk of wiretapping, it is necessary to provide a highly reliably single-photon source.

In a conventional quantum cryptography experiment, a diminished laser beam pulse has been used as a quasi-single-photon source (Rev. Mod. Phys., vol. 74, 145 (2002)). With this technology, the probability of existence of photons is reduced to the level of about 1 photon per 10 pulses in average, by diminishing the laser beam power by using an attenuator. In this technology, it becomes possible to achieve various advantages such as simple system setup, capability of changing the wavelength, capability of operation at room temperature, and the like.

In this conventional technology, on the other hand, because of the fact that the timing of emission of single photon complies with the Poisson distribution, there can arise the situations with finite probability that no photon emission occurs at all or several photons are emitted simultaneously. Thus, such a conventional system has a drawback in that efficiency of photoemission is poor. Further, such a conventional system has a problem of vulnerability to attack by a third party. More specifically, the aforementioned security of quantum cryptography is guaranteed only for the case in which there occurs single-photon emission, as noted previously. This security pertinent to the quantum cryptography vanishes when there are formed several photons simultaneously.

There are known mechanisms of single-photon generation that use the principles different from the one that attenuates a laser beam.

For example, Kim, et al., reports a single-photon turn-style device that generates a single photon for each external modulation electric field, by using the effect of Coulomb blockade occurring at a pn junction of semiconductor (Nature, vol. 397, 500 (1999)). Further, Lounis et al., report that single photons can be generated with repetition of 6.25 MHz at the maximum, by embedding molecules of terrylene into a thin film of p-terphenyl (Nature, vol. 407, 491 (2000)).

However, the former proposal has a drawback in that the operational temperature is extremely low (50 mK), and there arises a problem associated with this that unnecessary photons are formed by the background current. In the latter proposal, on the other hand, p-terphenyl in the matrix produces unnecessary photons. Thus, none of these conventional proposals could provide the solution leading to practical quantum cryptography device.

It should be noted that next two requirements are imposed for a single-photon optical source used for a quantum cryptography device.

① There should occur no simultaneous emission of plural photons (anti-bunching)

② Capability of emitting a single photon with desired timing (photon on-demand)

Conventionally, there have been problems in any of ① and ② or in both of these. If the requirement ① is not satisfied, there would occur increase in the probability of overlooking wiretapping. When the requirement ② is not satisfied, on the other hand, the error at the reception side is increased and sufficient bit rate is not achieved.

SUMMARY OF THE INVENTION

Accordingly, it is a general object of the present invention to provide a novel and useful optical source wherein the foregoing problems are eliminated.

Another and more specific object of the present invention is to provide a single-photon generator satisfying the foregoing conditions simultaneously and a single photon formation method.

Another object of the present invention is to provide a single-photon generator, comprising:

an exciton generation part including therein a quantum dot;

an excitation part for generating an exciton in said exciton generator part;

a recombination control part for controlling recombination timing of said exciton in said exciton generation part; and an optical window provided in said exciton generation part so as to pass a single photon formed as a result of recombination of said exciton, said recombination control part causing, in said exciton generation part, recombination of said exciton at longer intervals than a recombination lifetime of a exciton molecule.

Another object of the present invention is to provide a single-photon generating method, comprising the steps of:

forming an exciton in a medium; and generating a single photon by causing recombination in said exciton, said recombination step being conducted with an interval longer than a recombination lifetime of a exciton molecule in said medium.

The present invention relies on the principle that the recombination lifetime of an exciton that produces a single photon as a result of recombination is longer than the recombination lifetime of an exciton molecule (biexciton) that produces a plurality of photons as a result of the recombination.

Thus, according to the present invention, it becomes possible to extract a single photon with reliability at the time of generating a single photon in a medium that constitutes the exciton generation part as a result of recombination of the exciton thus excited, by conducting the recombination of the exciton with such a timing that that the recombination of the exciton molecules excited simultaneously in the medium is over. It should be noted that such an exciton can be formed easily by causing optical excitation in a quantum dot, particularly the quantum dot forming a heterojunction of type II.

Thus, according to the present invention, it becomes possible to extract a single photon with reliability at the time of generating a single photon by the recombination of an exciton excited in the medium that forms the exciton generation part, by causing the recombination of the exciton with such a timing that the recombination of the exciton molecules excited simultaneously in the medium is over. It should be noted that such an exciton can be formed easily by optical excitation in a quantum dot, particularly in the quantum dot forming a heterojunction of type II. By using the single-photon generator and the single-photon generation method of the present invention, it becomes possible to realize a long distance communication system capable of conducting secure and reliable key delivery.

Other objects and further features of the present invention will become apparent from the following detailed description when read in conjunction-with the attached drawings.

DETAILED DESCRIPTION OF THE INVENTION

First Embodiment

Figure 1:
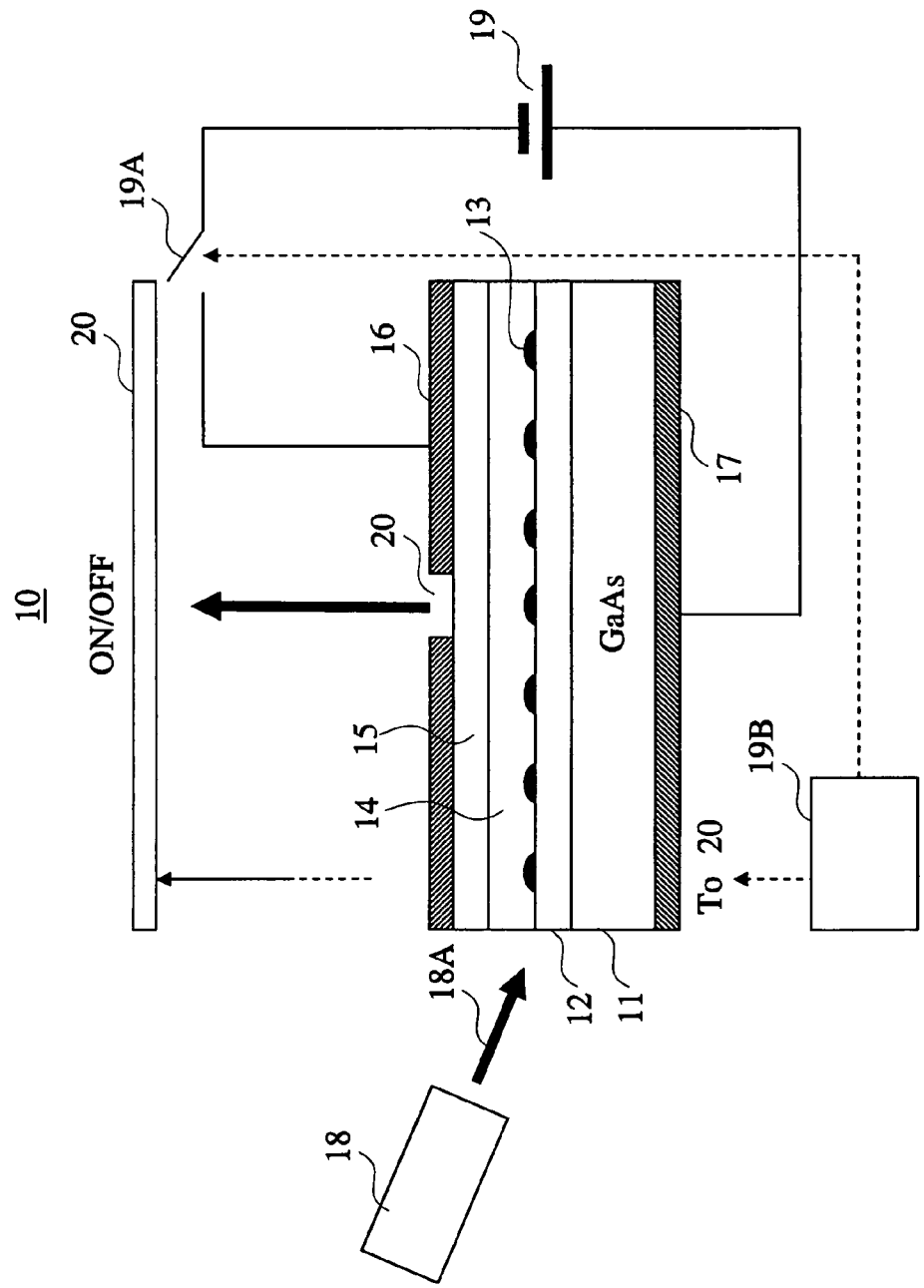
FIG. 1 is a diagram showing the construction of a single-photon generator according to a first embodiment of the present invention.

FIG. 1 shows the construction of a single-photon generator 10 according to a first embodiment of the present invention. Referring to FIG. 1, the single-photon generator 10 includes an undoped AlAs barrier layer 12 formed epitaxially on an n-type GaAs substrate 11 with a thickness of 20-30 nm, and quantum dots 13 of an InAs-GaSb system are formed with a large number on the AlAs barrier layer 12 with the S-K (Stranski-Krastanow) mode growth mechanism to be explained later.

Figure 2:
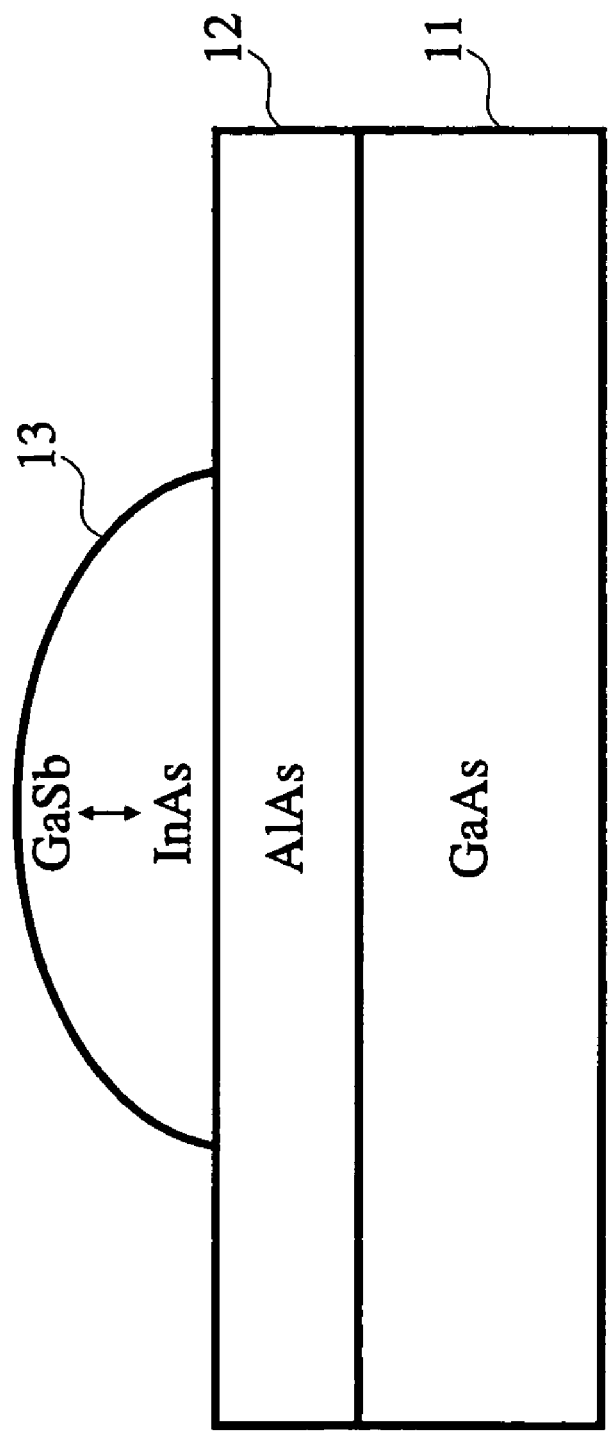
FIG. 2 is a diagram showing a part of the single-photon generator of FIG. 1 with an enlarged scale.

As shown in FIG. 2, each of the quantum dots 13 has a compositional gradient therein, and thus has a compositional profile, such that the inside of the quantum dot is enriched with InAs and the outside of the quantum dot is enriched with GaSb.

Further, another undoped AlAs barrier layer 14 of about 20-30 nm in the thickness is formed epitaxially on the barrier layer 12 so as to bury the quantum dot 13, and a p-type GaAs contact layer 15 of about 20 nm thickness is formed epitaxially on the barrier layer 14.

On the contact layer, an upper electrode 16 having an optical window 16A in correspondence to one of the plural quantum dots 13 is provided in ohmic contact therewith, such that the optical window 16A is located immediately above the foregoing quantum dot, and a lower electrode 17 is formed on the bottom surface of the GaAs substrate 11 in ohmic contact therewith.

The single-photon generator 10 of FIG. 1 further includes a laser diode 18 having an oscillation wavelength of 800 nm-1 μm provided so as to illuminate the quantum dot 13, wherein the laser diode 18 causes excitation of excitons by emitting a laser beam 18A to the quantum dot 13 as will be explained with reference to FIG. 3A.

Further, the single-photon generator 10 of FIG. 1 includes a bias power supply 19 connected between the electrodes 16 and 17 through a switch circuit 19A, and a reverse bias voltage is applied to the electrodes 16 and 17 from the bias power supply 19 when the switch circuit 19A is closed under control of the control circuit 19B.

Figures 3A, 3B:
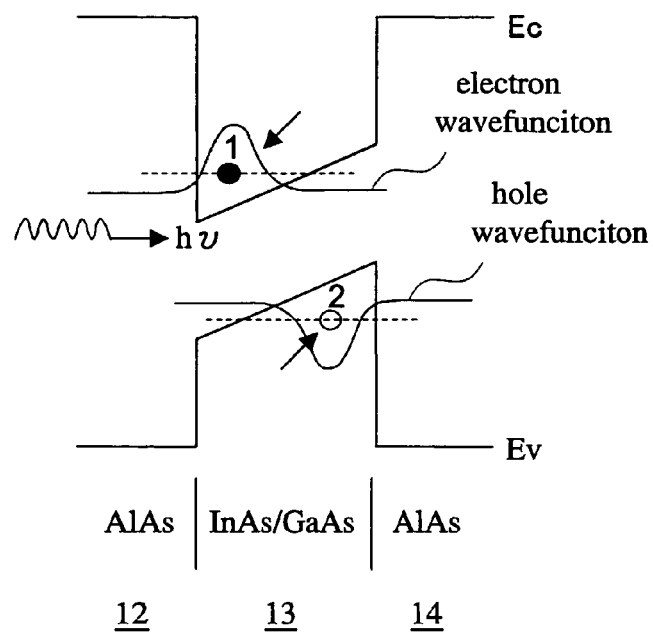
FIGS. 3A and 3B are diagrams explaining the principle of the single-photon generator of FIG. 1.

FIG. 3A shows the band diagram of the quantum dot 13 of FIG. 1 in an unbiased state.

Referring to FIG. 3A, an electron 1 and a hole 2 are excited in the quantum dot 13 when an excitation optical pulse having a wavelength ν corresponding to the bandgap of the quantum dot 13 comes in to the quantum dot 13. Because the conduction band Ec and the valence band Ev are inclined in the quantum dot 13 in correspondence to the compositional gradation explained previously, the electron thus excited is held in the lower end part of the quantum dot 13 enriched with InAs while the hole is held in the upper end part of the quantum dot 13 enriched with GaSb. Thereby, the electron and the hole are separated spatially as shown in the arrow in the drawing. Thus, the electron and hole are held in a polarized state and form an exciton. Because there is little overlapping of wavefunction between the electron and the hole, such an exciton is stable, and a recombination lifetime reaching 1.7-1.8 nanoseconds is achieved.

When the switch 19A is closed as shown in FIG. 3B, on the other hand, and a reverse bias voltage is applied between the electrode 16 and 17, and the band in the quantum dot 13 is flattened by the effect of the applied electric field. Thereby, the polarization or localization of the electron 1 and the hole 2 shown in FIG. 3A vanishes. In this case, an overlap is caused in the wavefunction of the electron and the wavefunction of the hole, and the electron 1 and the hole 2 cause recombination easily in the quantum dot 13. As a result of such a recombination, a single photon 3 is emitted.

The single photon thus formed exits through the optical window 16A in the electrode 16 as shown in FIG. 1 and is gated by an optical gate member 20 such as an acousto-optic device, which is controlled in synchronization with the switch circuit 19A by a control unit 19B. The single photon thus obtained is supplied to a quantum computer not illustrated.

Figure 4:
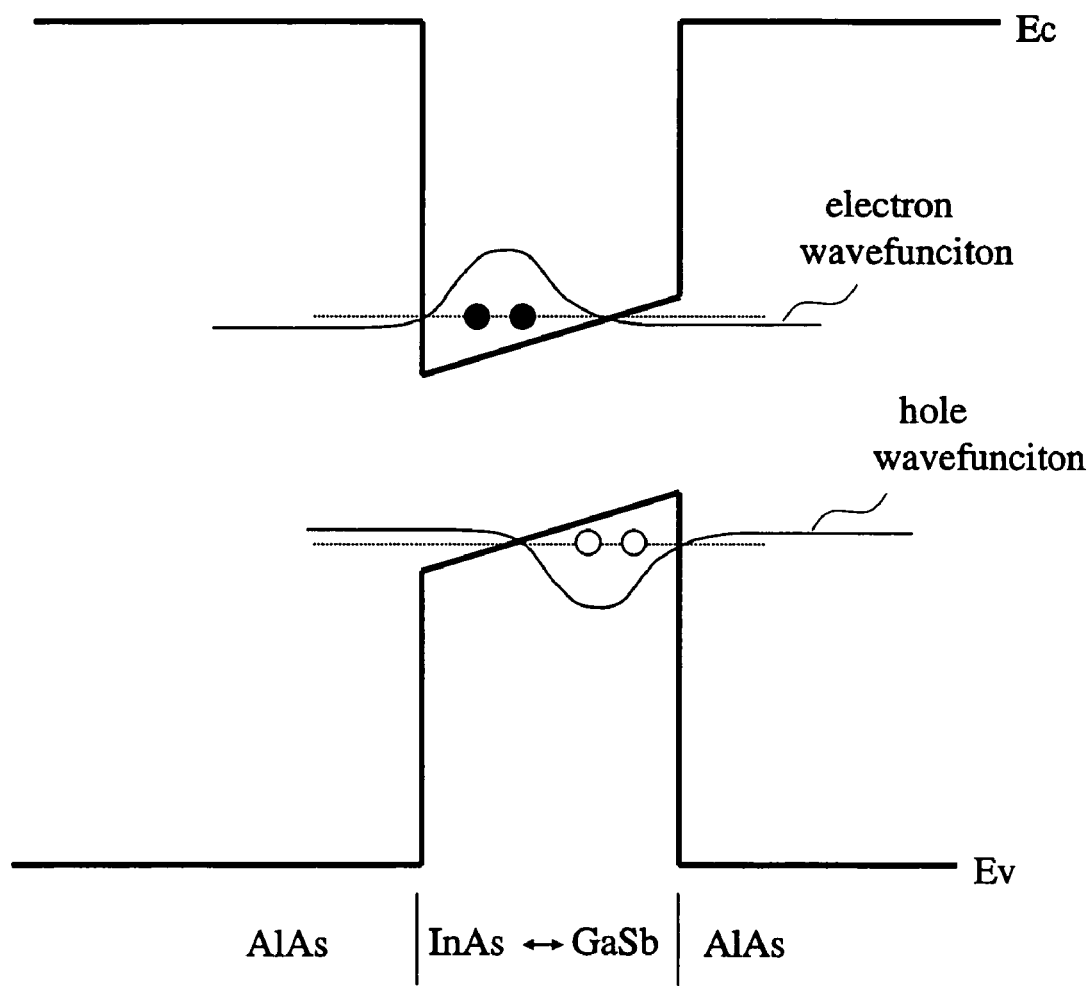
FIG. 4 is a diagram showing the distribution of exciton molecules formed in a single quantum dot in the single-photon generator of FIG. 1.

In the excitation process that uses the laser 18 of FIG. 3A, there are cases in which plural electrons and holes are excited by the irradiation of the excitation optical beam, and thus, it is generally inevitable that there occurs formation of exciton molecules (exciton molecules) in addition to the exciton. In the case of such a exciton molecule, on the other hand, the degree of spatial separation of electron and hole is small as compared with the case of exciton shown in FIG. 3A, as schematically shown in FIG. 4, and thus, the electron and hole in the exciton molecule are annihilated efficiently in short time by causing recombination, typically within several hundred picoseconds, after the excitation. In the case of the exciton, the spatial separation between the electron and hole is large as explained before and a recombination lifetime of about 1.7-1.8 nanoseconds, which is longer than the recombination lifetime of a exciton molecule, is achieved.

Thus, in the single-photon generator 10 of FIG. 1, it becomes possible to produce only one single photon with reliability by constructing the control unit 19B such that the control unit 19B drives the switch 19A after the excitation by the laser beam 18A with the timing such that the recombination lifetime of exciton molecule has elapsed. For example, the control unit 19B drives the switch 19A after 1 nanosecond has elapsed after the excitation by the laser beam has been conducted. Thereby, the photons emitted by the recombination of the exciton molecules prior to the emission of the single photon are cut off successfully by synchronizing the optical gate member 20 with the switch circuit 19A.

For such an optical gate member 20, it is possible to use a high speed optical switching device that uses an electrooptic crystal such as $KH_2PO_4$, $NH_4H_2PO_4$, $LiNbO_3$, $LiTaO_3$, and the like.

In the case the quantum dot 13 is formed by the S-K mode growth process, the distribution of the quantum dots 13 on the AlAs barrier layer 12 generally becomes random. Because the optical window 16A is formed in the electrode 16 in the single-photon generator 10 of FIG. 1 in correspondence to one of the plural quantum dots 13, the photon emission from other quantum dots are blocked by the electrode 16. In other words, the electrode 16 functions also as an optical mask in the single-photon generator 10 of FIG. 1.

FIGS. 5A-5D are diagrams explaining the operation of the single-photon generator 10 of FIG. 1.

Figure 5:
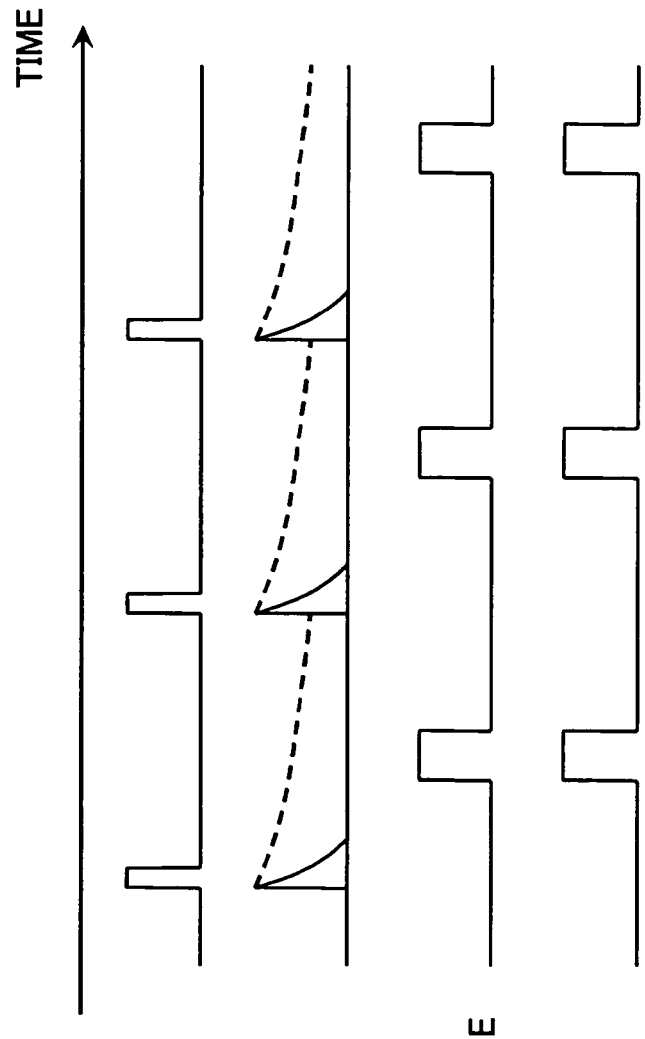
FIGS. 5A-5D are diagrams explaining the operation of the single-photon generator of FIG. 1.

Referring to FIGS. 5A and 5B, there occurs excitation of exciton or exciton molecules in correspondence to each optical pulse in the laser beam 18A produced by the laser diode 18 as shown in FIG. 5B, wherein the exciton molecules formed of plural electrons and holes are annihilated immediately as shown in FIG. 5B by a continuous line. On the other hand, the exciton formed of a single electron and a single hole has a long recombination lifetime and remains even after the exciton molecules have disappeared as shown in FIG. 5B by a broken line.

Thus, in the single-photon generator 10 of FIG. 1, the control unit 19B drives the switch 19A with the timing of FIG. 5C, and as a result, a single electron is emitted with the timing shown in FIG. 5C.

Further, by driving the optical gate member 20 with the timing of FIG. 5D in the single-photon generator 10 of FIG. 1, it becomes possible to take out only the necessary single photon for use in the external quantum computer, and the like.

Second Embodiment

Next, the method of forming the quantum dot 13 used with the construction of FIG. 1 will be explained briefly with reference to FIG. 6 as a second embodiment of the present invention.

Figure 6:
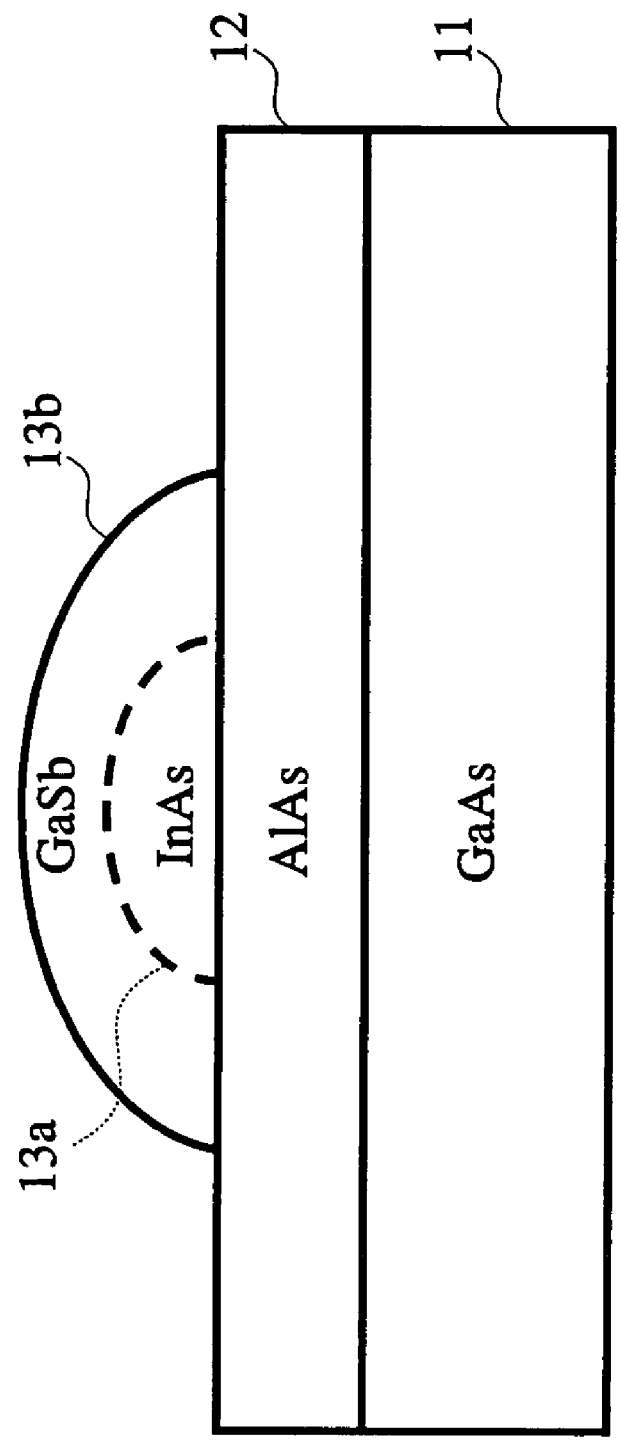
FIG. 6 is a diagram explaining the preparation method of the quantum dot according to a second embodiment of the present invention.

Referring to FIG. 6, a GaAs substrate 11 formed with an AlAs layer 12 epitaxially thereon is introduced into an MBE apparatus and is held to a substrate temperature of 600° C. Further, an InAs layer 13a is formed on the AlAs layer 12 with a thickness of 2-3 molecular layers by using molecular beams from an In cell and an As cell held to respective cell temperatures of 850° C. and 300° C. Because the InAs layer 13a forms a strained system with respect to the GaAs substrate 11, the In atoms and the As atoms deposited on the AlAs layer 12 gather together on the surface, and there is formed an island or dot 13a of InAs having a diameter is of about 20 nm.

In the present embodiment, a GaSb layer, forming a type II heterojunction to InAs, is formed on the InAs layer 13a with the thickness of about 15 molecular layers, after the InAs dots 13a are thus formed, by using the molecular beams from a Ga cell and a Sb cell held respectively to the cell temperatures of 950° C. and 480° C. In this case, because of the effect of the lattice strained system explained before, the Ga atoms and the Sb atoms concentrate on the InAs dot 13a, and there is formed a GaSb layer 13b on the InAs dot 13a. It is known that such an InAs/GaSb dot forms a type II heterojunction in the case the diameter is smaller than 87 Å. (Phys. Rev. B. vol.48, 4643 (1993)).

Figure 7:
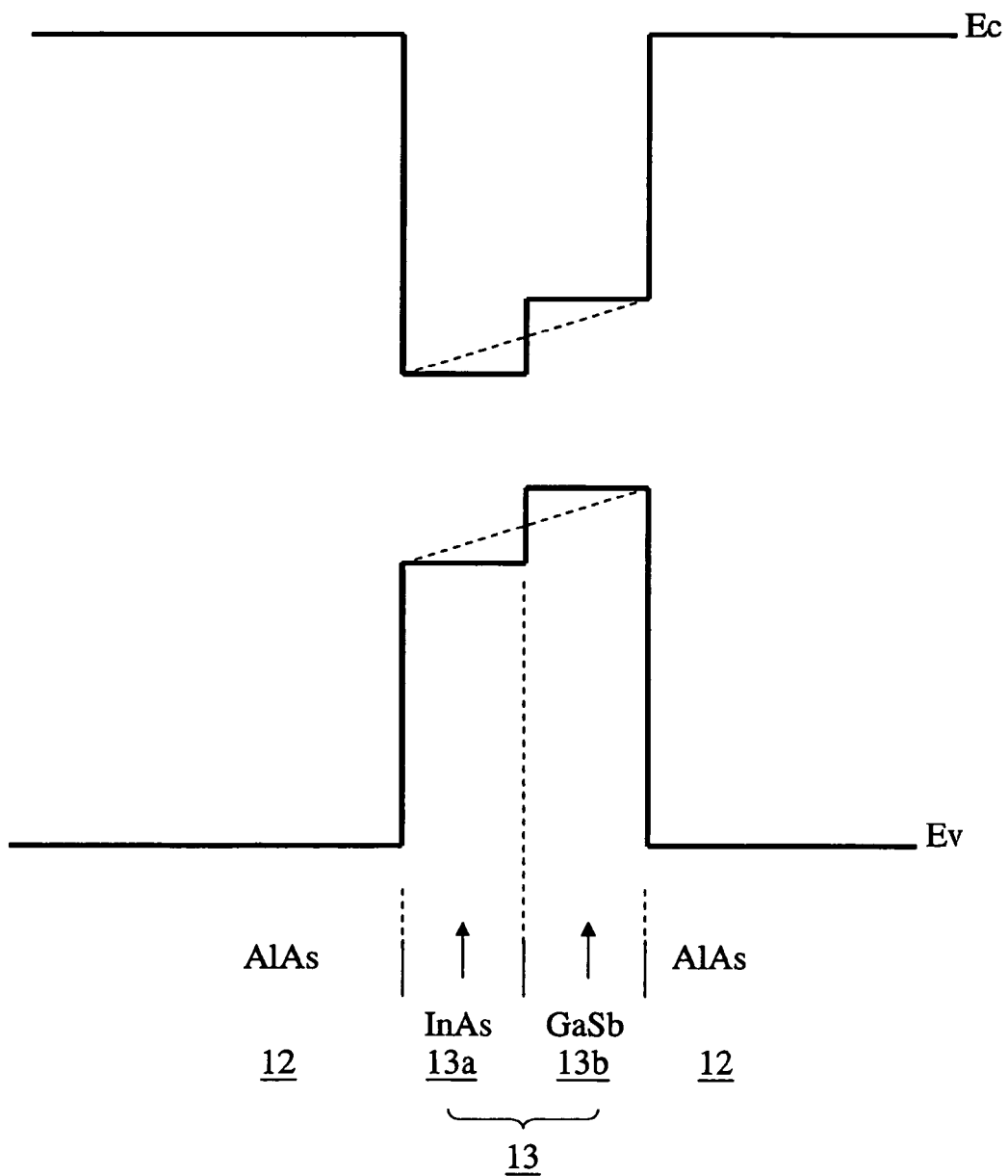
FIG. 7 is a diagram showing the band structure of the quantum dot of FIG. 6.

FIG. 7 shows the band diagram of the structure of FIG. 6 thus formed.

Referring to FIG. 7, it can be seen that there is formed a heterojunction of type II between the InAs dot 13a and the GaSb dot 13b as shown in the continuous line in the drawing. Thereby, it is believed that there is formed a single dot having a compositional gradation as shown in the drawing by a broken line because of the mixing of elements caused between the GaSb dot 13b and the InAs dot 13a during the growth of the GaSb dot 13b. Typically, such a dot has a diameter of about 20-50 nm and a height of about 5-10 nm and forms the quantum dot 13 in which the carriers are confined in three dimensions.

In the foregoing embodiment, the quantum dot 13 including therein the heterojunction of type II is not limited to the lamination of InAs and GaSb but it is also possible to use a lamination of InGaP and InP or GaAsSb and InP. Furthermore, the substrate 11 is not limited to GaAs but it is also possible to use an InP substrate or a GaP substrate, provided that it forms a strained system with regard to the quantum dot 13.

Further, the quantum dot 13 can be formed also by using an MOCVD process, in addition to the MBE process.

Further, the present invention is not limited to the embodiments described heretofore, but various variations and modifications may be made without departing from the scope of the invention.

What is claimed is:

1. A single-photon generator, comprising:
   an exciton generation part including therein a quantum dot having a band structure holding a single exciton;
   an excitation part generating a plurality of excitons, including said single exciton, in said exciton generation part; and a recombination control part controlling a recombination timing of said single exciton in said exciton generation part;

wherein said recombination control part, after generation of said plurality of excitons, causes recombination of the plurality of excitons excluding the single exciton in said exciton generation part, and subsequently changes said band structure to cause recombination of said single exciton in said exciton generation part.

2. The single-photon generator as claimed in claim 1, wherein said exciton generation part includes a type II heterojunction in said quantum dot.

3. The single-photon generator as claimed in claim 2, wherein said quantum dot changes a composition thereof from one side of said quantum dot to another side of said quantum dot continuously.

4. The single-photon generator as claimed in claim 1, wherein said quantum dot is formed of a quantum dot grown by a S-K mode growth process.

5. The single-photon generator as claimed in claim 1, wherein said quantum dot is formed of a lamination of an InAs layer and a GaSb layer sandwiched between a pair of AlAs layers, said InAs layer changing a composition thereof continuously toward said GaSb layer.

6. The single-photon generator as claimed in claim 1, wherein said recombination control part comprises an electrode provided in said exciton generation part, a voltage source applying a bias voltage to said electrode, and a switch circuit controlling application of said bias voltage from the voltage source to said electrode with a longer interval than a recombination lifetime of an exciton molecule, wherein the exciton molecule is excited simultaneously in the exciton generation part as said plurality of excitons.

7. The single-photon generator as claimed in claim 1, further comprising:
an optical gate member provided on a path of a single photon, the single photon is formed as a result of the recombination of said single exciton.

8. The single-photon generator as claimed in claim 7, wherein said optical gate member is controlled by said recombination control part and passes said single photon in synchronization with the recombination of said single exciton.

9. The single-photon generator as claimed in claim 1, wherein said excitation part comprises a laser.

10. The single-photon generator as claimed in claim 1, further comprising:
an optical window provided in said exciton generation part so as to pass a single photon formed as a result of the recombination of said single exciton.

11. The single-photon generator as claimed in claim 10, wherein said optical window is provided in said electrode.

12. A single-photon generating method, comprising:
forming, in a medium having a band structure holding a single exciton, a plurality of excitons including said single exciton;
causing recombination of the plurality of excitons excluding said single exciton in said medium; and
changing said band structure after said causing recombination to cause recombination of said single exciton in said medium.

13. The single-photon generating method as claimed in claim 12, wherein said causing recombination includes applying an electric field to said medium.

14. The single-photon generating method as claimed in claim 12, wherein said medium includes a quantum dot of type II heterojunction.

15. The single-photon generating method as claimed in claim 14, wherein said medium is formed of a quantum dot having a composition thereof, the composition being changed from one side of said quantum dot to the other side of said quantum dot continuously.

16. The single-photon generating method as claimed in claim 12, wherein said quantum dot is formed of a quantum dot grown by a S-K mode growth process.

17. The single-photon generating method as claimed in claim 12, wherein said quantum dot is formed of a lamination of an InAs layer and a GaSb layer sandwiched by a pair of AlAs layers, said InAs layer changing a composition thereof continuously toward said GaSb layer.

18. The single-photon generating method as claimed in claim 12, wherein said causing recombination controls a recombination timing of said single exciton in said medium by controlling an application of a bias voltage from a voltage source to an electrode which is provided with respect to said medium with a longer interval than a recombination lifetime of an exciton molecule excited simultaneously in said medium as said plurality of excitons.

19. The single-photon generating method as claimed in claim 12, wherein said causing recombination controls an optical gate member provided on a path of a single photon, which is formed as a result of the recombination of said single exciton, in synchronization with the recombination of said single exciton.

20. A single-photon generator, comprising:
an exciton generation part including therein a quantum dot;
an excitation part for generating an exciton in said exciton generation part;
a recombination control part for controlling recombination timing of said exciton in said exciton generation part; and
an optical window provided in said exciton generation part so as to pass a single photon formed as a result of recombination of said exciton,
said recombination control part causing, in said exciton generation part, recombination of said exciton at longer intervals than a recombination lifetime of an exciton molecule; and
wherein said quantum dot is formed of a lamination of an InAs layer and a GaSb layer sandwiched by a pair of AlAs layers, said InAs layer changing a composition thereof continuously toward said GaSb layer.

* * * * *